United States Patent
Li et al.

(10) Patent No.: US 11,475,826 B2
(45) Date of Patent: Oct. 18, 2022

(54) SHIFT REGISTER HAVING ISOLATION CIRCUITS, LIGHT-EMITTING CONTROL CIRCUIT, AND DISPLAY PANEL

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xinguo Li, Beijing (CN); Chen Xu, Beijing (CN); Xinyin Wu, Beijing (CN); Yong Qiao, Beijing (CN); Xueguang Hao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/622,449

(22) PCT Filed: Mar. 18, 2019

(86) PCT No.: PCT/CN2019/078499
§ 371 (c)(1),
(2) Date: Dec. 13, 2019

(87) PCT Pub. No.: WO2020/113847
PCT Pub. Date: Jun. 11, 2020

(65) Prior Publication Data
US 2021/0366354 A1 Nov. 25, 2021

(30) Foreign Application Priority Data
Dec. 6, 2018 (CN) .......................... 201822041979.3

(51) Int. Cl.
*G09G 3/20* (2006.01)
*G09G 3/00* (2006.01)
(Continued)

(52) U.S. Cl.
CPC .......... *G09G 3/2092* (2013.01); *G09G 3/007* (2013.01); *G09G 3/3225* (2013.01); *G09G 2310/0286* (2013.01); *G11C 19/28* (2013.01)

(58) Field of Classification Search
CPC .... G09G 3/2092; G09G 3/007; G09G 3/3225; G09G 2310/0286; G09G 3/3258; G09G 3/3696; G11C 19/28; G11C 19/00
See application file for complete search history.

(56) References Cited

U.S. PATENT DOCUMENTS

2013/0321372 A1* 12/2013 Hung .................. G11C 19/00
345/211
2016/0189648 A1* 6/2016 Xiao .................. G11C 19/28
345/212
(Continued)

FOREIGN PATENT DOCUMENTS

CN  103474038 A  12/2013
CN  104318904 A  1/2015
(Continued)

OTHER PUBLICATIONS

International Search Report dated Sep. 11, 2019, issued in counterpart application No. PCT/CN2019/078499. (10 pages).
(Continued)

*Primary Examiner* — Richard J Hong
(74) *Attorney, Agent, or Firm* — WHDA, LLP

(57) ABSTRACT

The present disclosure relates to a shift register for a display panel. The shift register may include an input terminal, an output terminal, an input unit, an output unit, a first control unit, a second control unit, and a first isolation unit. The output unit may be configured to transmit a first level or a second level to an output terminal based on levels of a first node and a second node.

18 Claims, 9 Drawing Sheets

(51) Int. Cl.
    *G09G 3/3225*     (2016.01)
    *G11C 19/28*     (2006.01)

(56) References Cited

U.S. PATENT DOCUMENTS

| | | |
|---|---|---|
| 2016/0329015 A1 | 11/2016 | Ji et al. |
| 2016/0372042 A1* | 12/2016 | Ma .................. G09G 3/3258 |
| 2017/0032752 A1 | 2/2017 | Huang et al. |
| 2017/0110081 A1 | 4/2017 | Han et al. |
| 2018/0144811 A1 | 5/2018 | Han et al. |
| 2018/0240382 A1* | 8/2018 | Choi .................. G09G 3/3696 |
| 2019/0130857 A1 | 5/2019 | Ma |
| 2020/0356203 A1 | 11/2020 | Wang et al. |

FOREIGN PATENT DOCUMENTS

| | | |
|---|---|---|
| CN | 105304013 A | 2/2016 |
| CN | 105845183 A | 8/2016 |
| CN | 106782284 A | 5/2017 |
| CN | 106952625 A | 7/2017 |
| CN | 108257567 A | 7/2018 |
| EP | 3358561 A1 | 8/2018 |
| KR | 10-2014-0096613 A | 8/2014 |
| KR | 10-2015-0079248 A | 7/2015 |

OTHER PUBLICATIONS

Office Action dated Nov. 29, 2020, issued in counterpart KR Application No. 10-2019-7031889, with English Translation. (17 pages).

Office Action dated Aug. 19, 2021, issued in counterpart IN Application No. 201947046312, with English Translation. (6 pages).

The Extended (Supplementary) European Search Report dated Jun. 22, 2022, issued in counterpart EP Application No. 19828952.2. (18 pages).

* cited by examiner

SHIFT REGISTER HAVING ISOLATION CIRCUITS, LIGHT-EMITTING CONTROL CIRCUIT, AND DISPLAY PANEL

CROSS-REFERENCE TO RELATED APPLICATIONS

This application claims benefit of the filing date of Chinese Patent Application No. 201822041979.3 filed on Dec. 6, 2018, the disclosure of which is hereby incorporated in its entirety by reference.

TECHNICAL FIELD

The present disclosure relates to display technology, in particular, to a shift register, a light-emitting control circuit, and a display panel.

BACKGROUND

Organic Light-Emitting Diode (OLED) display panels are widely used in television, mobile phones, public information display and other fields. Gate lines of the OLED display panel need to be scanned line by line to realize the driving. To reduce the driver integrated circuit (Driver IC) and the cost, and realize a narrow bezel design, a gate driving circuit (GOA) can be directly provided at the edge of the display panel to provide a driving signal to the gate line.

The organic light-emitting diode in each pixel of the organic light-emitting diode display panel can be coupled in series with a light-emitting control transistor. By controlling whether the light-emitting control transistor is turned on or off, whether the organic light-emitting diode emits light can be determined. For this reason, an OLED driver IC for driving the light-emitting control transistor is further disposed in the OLED display panel.

BRIEF SUMMARY

An embodiment of the present disclosure provides a shift register for a display panel. The shift register may include an input terminal, an output terminal, an input unit, an output unit, a first control unit, a second control unit, and a first isolation unit. The input unit may be respectively coupled to the input terminal, a first node, and a fourth node, and configured to control levels of the first node and the fourth node based on a level of the input terminal. The first control unit may be respectively coupled to a second node and a third node and configured to control levels of the second node and the third node. The second control unit may be respectively coupled to the first node and the fourth node, and configured to transmit a second level to the first node based on the level of the fourth node. The first isolation unit may be between the third node and the fourth node, and configured to isolate the third node from the fourth node when the first control unit changes the level of the third node from a first level further in a direction away from the second level. The output unit may be configured to transmit a first level or a second level to an output terminal based on the levels of the first node and the second node.

Optionally, the first isolation unit comprises a first transistor; a first terminal of the first transistor is coupled to the fourth node, a second terminal of the first transistor is coupled to the third node, and a gate of the first transistor is coupled to a first level terminal.

Optionally, the shift register may further include a fifth node and a second isolation unit, wherein the second control unit is coupled to the fifth node and the fourth node; and the second isolation unit is between the fifth node and the first node and configured to isolate the first node from the fifth node when the level of the first node is changed from the first level further in a direction away from the second level.

Optionally, the second isolation unit comprises a second transistor; a first terminal of the second transistor is coupled to the fifth node, a second terminal of the second transistor is coupled to the first node, and a gate of the second transistor is coupled to the first level terminal.

Optionally, the first transistor and/or the second transistor are double-gate transistors.

Optionally, the first transistor and/or the second transistor are metal oxide transistors.

Optionally, the input unit comprises a third transistor, a fourth transistor, a fifth transistor, and a first capacitor; wherein a first terminal of the third transistor is coupled to the input terminal, a second terminal of the third transistor is coupled to the fifth node, and a gate of the third transistor is coupled to a first clock terminal; a first terminal of the fourth transistor is coupled to the fourth node, a second terminal of the fourth transistor is coupled to the first clock terminal, and a gate of the fourth transistor is coupled to the fifth node; a first terminal of the fifth transistor is coupled to the first level terminal, a second terminal of the fifth transistor is coupled to the fourth node, and a gate of the fifth transistor is coupled to the first clock terminal; and a first terminal of the first capacitor is coupled to the first node, and a second terminal of the first capacitor is coupled to a second clock terminal.

Optionally, the fourth transistor is a double-gate transistor.

Optionally, the output unit comprises a sixth transistor and a seventh transistor, wherein a first terminal of the sixth transistor is coupled to the second level terminal, a second terminal of the sixth transistor is coupled to the output terminal, and a gate of the sixth transistor is coupled to the second node; and a first terminal of the seventh transistor is coupled to the output terminal, a second terminal of the seventh transistor is coupled to the first level terminal, and a gate of the seventh transistor is coupled to the first node.

Optionally, the first control unit comprises an eighth transistor, a ninth transistor, a tenth transistor, a second capacitor, and a third capacitor, wherein a first terminal of the eighth transistor is coupled to the second clock terminal, a second terminal of the eighth transistor is coupled to a second terminal of the third capacitor, and a gate of the eighth transistor is coupled to the third node; a first terminal of the ninth transistor is coupled to the second terminal of the third capacitor, a second terminal of the ninth transistor is coupled to the second node, and a gate of the ninth transistor is coupled to the second clock terminal; a first terminal of the tenth transistor is coupled to the second node, a second terminal of the tenth transistor is coupled to the second level terminal, and a gate of the tenth transistor is coupled to the fifth node; a first terminal of the second capacitor is coupled to the second level terminal, and a second terminal of the second capacitor is coupled to the second node; and a first terminal of the third capacitor is coupled to the third node.

Optionally, the first control unit comprises an eighth transistor, a ninth transistor, a tenth transistor, a second capacitor, and a third capacitor, wherein a first terminal of the eighth transistor is coupled to the first level terminal, a second terminal of the eighth transistor is coupled to a first terminal of the ninth transistor, and a gate of the eighth transistor is coupled to the third node; a second terminal of the ninth transistor is coupled to the second node, and a gate of the ninth transistor is coupled to the second clock terminal; a first terminal of the tenth transistor is coupled to the second node, a second terminal of the tenth transistor is coupled to the second level terminal, and a gate of the tenth transistor is coupled to the fifth node; a first terminal of the second capacitor is coupled to the second level terminal, and a second terminal of the second capacitor is coupled to the second node; and a first terminal of the third capacitor is coupled to the second clock terminal, and a second terminal of the third capacitor is coupled to the third node.

Optionally, the second control unit comprises an eleventh transistor and a twelfth transistor; wherein a first terminal of the eleventh transistor is coupled to the second level terminal, a second terminal of the eleventh transistor is coupled to the fifth node, and a gate of the eleventh transistor is coupled to the second terminal of the twelfth transistor; and a first terminal of the twelfth transistor is coupled to the second clock terminal, and a gate of the twelfth transistor is coupled to the fourth node.

Optionally, the second control unit comprises an eleventh transistor and a twelfth transistor; wherein a first terminal of the eleventh transistor is coupled to a second terminal of the twelfth transistor, a second terminal of the eleventh transistor is coupled to the fifth node, and a gate of the eleventh transistor is coupled to the second clock terminal; and a first terminal of the twelfth transistor is coupled to the first level terminal, and a gate of the twelfth transistor is coupled to the fourth node.

One example of the present disclosure is a light-emitting control circuit, comprising a plurality of cascaded shift registers, each of the plurality of cascaded shift registers being the shift register according to one embodiment of the present disclosure.

One example of the present disclosure is a display panel, comprising the light-emitting control circuit according to one embodiment of the present disclosure.

Optionally, the display panel further includes a plurality of pixel circuits; wherein each of the plurality of pixel circuits comprises a light-emitting element and at least one light-emitting control transistor, a gate of the light-emitting control transistor being coupled to an output terminal of shift register of one stage in the light-emitting control circuit.

Optionally, the plurality of the pixel circuits are arranged in an array, rows of pixel circuits are divided into a plurality of groups, each of the plurality of groups comprising two adjacent rows of pixel circuits, and gates of light-emitting control transistors in the two rows of pixel circuits of the same group are coupled to an output terminal of shift register of the same stage in the light-emitting control circuit.

Optionally, the display panel includes two light-emitting control circuits respectively disposed on two opposite sides of the display panel; a gate of a light-emitting control transistor of each pixel circuit is respectively coupled to output terminals of shift registers of the same stage in the two light-emitting control circuits.

Optionally, the display panel further includes a gate driving circuit for supplying a driving signal to each of the pixel circuits, wherein the gate driving circuit is coupled to a plurality of gate lines, and each of the pixel circuits is disposed in a display area; the gate driving circuit and the light-emitting control circuit are both disposed outside the display area, and the light-emitting control circuit is located at a side of the gate driving circuit opposite from the display area.

Optionally, the light-emitting element is an organic light-emitting diode.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
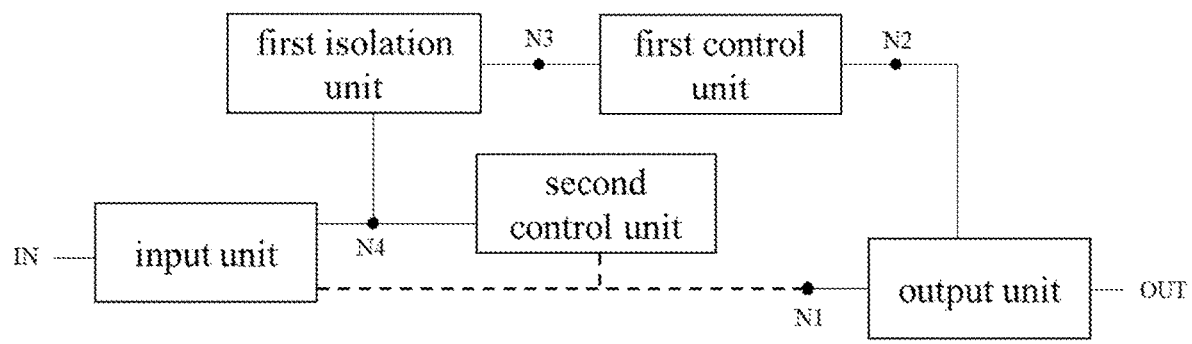
FIG. 1 is a block structural diagram of a shift register according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

In the description of the following embodiments, specific features, structures, materials or characteristics may be combined in any suitable manner in any one or more embodiments or examples.

Example 1

FIG. 1 shows a block structural diagram of a shift register according to one embodiment of the present disclosure. FIG.

Figure 2:
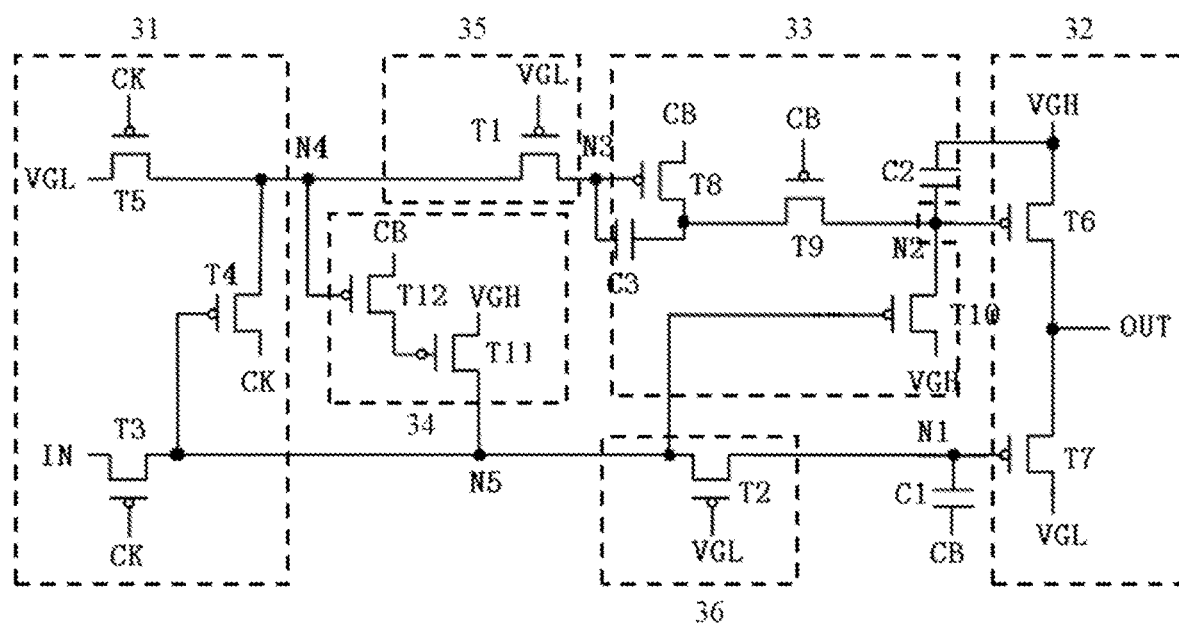
FIG. 2 is a schematic structural diagram of a shift register according to one embodiment of the present disclosure.

2 shows a schematic structural diagram of a shift register according to one embodiment of the present disclosure. As shown in FIG. 1 and FIG. 2, one embodiment of the present disclosure provides a shift register including an input terminal IN, an output terminal OUT, a first node N1, a second node N2, a third node N3, a fourth node N4, an input unit 31, an output unit 32, a first control unit 33, a second control unit, 34 and a first isolation unit 35.

In one embodiment, the input unit is coupled to the input terminal IN, the first node N1, and the fourth node N4 respectively for controlling the levels of the first node N1 and the fourth node N4 based on the level of the input terminal IN. The first control unit is coupled to the second node N2 and the third node N3 respectively for controlling the levels of the second node N2 and the third node N3.

The second control unit is coupled to the first node N1 and the fourth node N4 for transmitting the second level to the first node N1 based on the level of the fourth node N4.

The first isolation unit is disposed between the third node N3 and the fourth node N4. The first isolation unit is configured to isolate the third node N3 from the fourth node N4 when the first control unit changes the level of the third node N3 from the first level in a direction away from the second level.

The output unit is configured to transmit the first level or the second level to the output terminal OUT based on the levels of the first node N1 and the second node N2. The output terminal OUT is used to connect to a gate of a light-emitting control transistor.

In the present disclosure, the coupling or connecting includes a direct connection and/or an indirect connection through other elements.

As shown in FIG. 1, in the shift register of the embodiment of the present disclosure, a signal for controlling the light-emitting of the pixel circuit can be generated at the output terminal OUT by the synergy of the respective units. Therefore, by assembling the plurality of shift registers into a light-emission control circuit, the light-emission of the light-emitting elements 20 of the pixel circuits of the display panel can be controlled without an EM Driver IC, thereby simplifying structure of the display panel, reducing its cost, and achieving a narrow bezel design.

The shift register of the embodiment of the present disclosure further includes a first isolation unit. When the first control unit controls the level of the third node N3 to change from the first level (such as a low level) to a direction further away from the second level (such as a lower value), the first isolation unit can isolate the third node N3 from the fourth node N4, so that the third node N3 is no longer affected by other circuits. Correspondingly, the level of the second node N2 is also more stable because the second node N2 is coupled to the third node N3 through the first control unit. Since the second node N2 controls the output of the shift register, the signal stability can improve the stability of the shift register output.

Optionally, the first isolation unit includes a first transistor T1. The first terminal of the first transistor T1 is coupled to the fourth node N4, the second terminal thereof is coupled to the third node N3, and the gate thereof is coupled to the first level terminal VGL.

That is, as shown in FIG. 2, the above first isolation unit may specifically be a transistor coupled in series between the fourth node N4 and the third node N3, and its gate is coupled to the first level terminal VGL (such as a low level end).

Optionally, referring to FIG. 2, the shift register further includes a fifth node N5 and a second isolation unit 36. In one embodiment, the second control unit is coupled to the fifth node N5 and the fourth node N4. The second isolation unit is disposed between the fifth node N5 and the first node N1. The second isolation unit is used for isolating the first node N1 from the fifth node N5 when the level of the first node N1 is further changed from the first level in the direction away from the second level.

That is, a second isolation unit may be disposed in the shift register, and the second isolation unit is disposed between the fifth node N5 and the first node N1. As such, the fifth node N5 and the first node N1 may be isolated to ensure that the level of the first node N1 is not affected by the levels of the fifth node N5 and the fourth node N4, and is thus more stable. Since the first node N1 is used to control the output of the control shift register, the shift register of the embodiment of the present disclosure has better output stability.

Optionally, the second isolation unit includes a second transistor T2. The first terminal of the second transistor T2 is coupled to the fifth node N5, the second terminal thereof is coupled to the first node N1, and the gate thereof is coupled to the first level terminal VGL.

That is to say, the above second isolation unit may specifically be a transistor coupled in series between the first node N1 and the fifth node N5, and its gate is coupled to the first level terminal VGL (such as a low level end).

Optionally, the first transistor T1 and/or the second transistor T2 are double-gate transistors.

That is to say, the first transistor T1 and the second transistor T2 are preferably transistors with a double gate structure for better electrical isolation, thereby better reducing the leakage current of the third node N3 and the first node N1 and further stabilizing the output of the shift register.

Of course, other transistors besides the first transistor T1 and the second transistor T2 may adopt a double-gate structure or other forms of transistors such as a single-gate structure.

Optionally, the first transistor T1 and/or the second transistor T2 are both metal oxide transistors. That is, the first transistor T1 and the second transistor T2 are preferably metal oxide (eg, indium gallium zinc oxide, IGZO) transistors. This is because metal oxide transistor has a lower leakage current for better electrical isolation and better reduction of the leakage current of the third node N3 and the first node N1. As such, the output of the shift register can be further stabilized.

Of course, other transistors besides the first transistor T1 and the second transistor T2 may also be metal oxide transistors, or other types of transistors such as low temperature polysilicon (LTPS) transistors.

Optionally, the input unit includes a third transistor T3, a fourth transistor T4, a fifth transistor T5, and a first capacitor C1; wherein:

The first terminal of the third transistor T3 is coupled to the input terminal IN, the second terminal thereof is coupled to the fifth node N5, and the gate thereof is coupled to the first clock terminal CK;

The first terminal of the fourth transistor T4 is coupled to the fourth node N4, the second terminal thereof is coupled to the first clock terminal CK, and the gate thereof is coupled to the fifth node N5;

The first terminal of the fifth transistor T5 is coupled to the first level terminal VGL, the second terminal thereof is coupled to the fourth node N4, and the gate thereof is coupled to the first clock terminal CK;

The first terminal of the first capacitor C1 is coupled to the first node N1, and the second terminal thereof is coupled to the second clock terminal CB.

Optionally, the fourth transistor T4 is a double-gate transistor. That is to say, the fourth transistor T4 is preferably a transistor with a double-gate structure to better reduce leakage current, thereby further stabilizing the output of the shift register.

Optionally, the output unit includes a sixth transistor T6 and a seventh transistor T7. In one embodiment, the first terminal of the sixth transistor T6 is coupled to the second level terminal VGH, the second terminal thereof is coupled to the output terminal OUT, and the gate thereof is coupled to the second node N2. The first terminal of the seventh transistor T7 is coupled to the output terminal OUT, the second terminal thereof is coupled to the first level terminal VGL, and the gate thereof is coupled to the first node N1.

Optionally, in one embodiment of the present disclosure, the first control unit includes an eighth transistor T8, a ninth transistor T9, a tenth transistor T10, a second capacitor C2, and a third capacitor C3; wherein The first terminal of the eighth transistor T8 is coupled to the second clock terminal CB, the second terminal thereof is coupled to the second terminal of the third capacitor C3, and the gate thereof is coupled to the third node N3;

The first terminal of the ninth transistor T9 is coupled to the second terminal of the third capacitor C3, the second terminal thereof is coupled to the second node N2, and the gate thereof is coupled to the second clock terminal CB;

The first terminal of the tenth transistor T10 is coupled to the second node N2, the second terminal thereof is coupled to the second level terminal VGH, and the gate thereof is coupled to the fifth node N5;

The first terminal of the second capacitor C2 is coupled to the second level terminal VGH, and the second terminal is coupled to the second node N2;

The first terminal of the third capacitor C3 is coupled to the third node N3.

Optionally, in one embodiment of the present disclosure, the second control unit includes an eleventh transistor T11 and a twelfth transistor T12. The first terminal of the eleventh transistor T11 is coupled to the second level terminal VGH, the second terminal thereof is coupled to the fifth node N5, and the gate thereof is coupled to the second terminal of the twelfth transistor T12. The first terminal of the twelfth transistor T12 is coupled to the second clock terminal CB, and the gate thereof is coupled to the fourth node N4.

In one embodiment, all transistors are P-type transistors.

The following describes the structure and operational process of the above shift register in more detail with a driving method.

Wherein, the first level is a turn-on level, that is, a level at which the transistor can be turned on when loaded on the gate of the transistor. The second level is a turned-off level, which is the level at which the transistor can be turned off when loaded on the gate of the transistor. Usually the higher of the two levels is a high level, and the lower of the two levels is a low level. Correspondingly, the clock signal is a signal that is periodically switched between two different levels, and these two levels are also commonly used to turn the transistor on and off, respectively. Thus, the higher of the two levels is usually called a high level, and the lower of the two levels is called a low level.

However, it should be understood that the specific level values of the high/low level in the first level and the second level are not necessarily equal to the level values of the high/low level in the clock signal, respectively. Of course, for the ease of driving, the two usually can be equal.

Specifically, the following description will be made by taking an example in which all transistors are P-type transistors. Since the on-level of the P-type transistor is low level and the off-level is high level, the first level and the lower level of the clock signal are hereinafter referred to as low level. Furthermore, the second level and the higher level of the clock signal are hereinafter referred to as high level.

Figure 5:
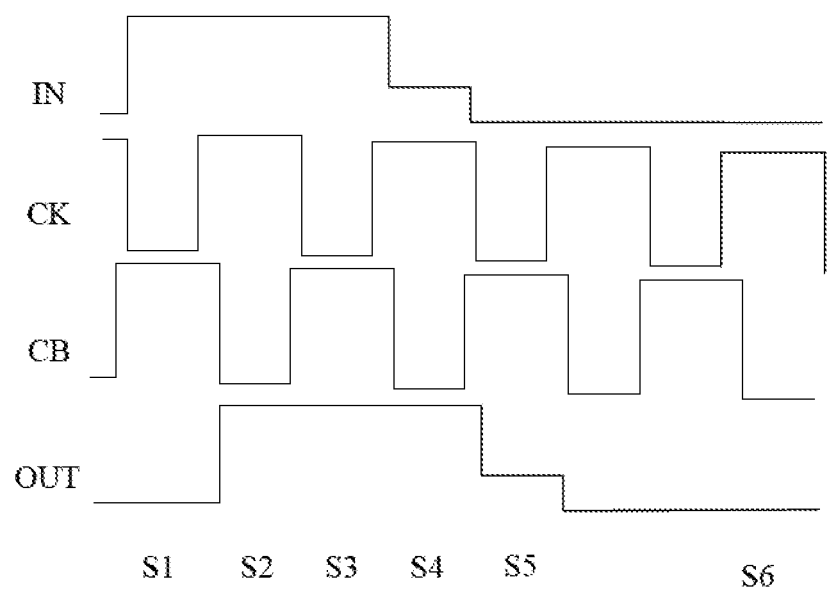
FIG. 5 is a driving timing chart of a shift register according to one embodiment of the present disclosure; FIG.

Specifically, as shown in FIG. 5, in the driving method of the shift register according to one embodiment of the present disclosure, a low level is continuously supplied to the first level terminal VGL, and a high level is continuously supplied to the second level terminal VGH, which will not be repeated in detail later.

For a P-type transistor, it is turned on when Vgs<Vth, and vice versa, wherein Vgs is a gate-source voltage of the transistor (ie, the voltage difference between the gate voltage and the first or second terminal), and Vth is a threshold voltage of the transistor. Since the gates of the first transistor T1 and the second transistor T2 continue to be at a low level, Vgs<Vth is generally satisfied and accordingly, these transistors are turned on. Only when the level of the first or second terminal of each of the two transistors is further lowered from the low level, Vgs>Vth can be obtained, thereby causing the first transistor T1 and the second transistor T2 to be turned off.

As shown in FIG. 5, the process of the driving method of the shift register according to one embodiment of the present disclosure specifically includes the following phases:

First phase S1 includes providing a high level to the input terminal IN, providing a low level to the first clock terminal CK, and providing a high level to the second clock terminal CB.

In this phase, the first clock terminal CK is at a low level, so the third transistor T3 and the fifth transistor T5 are turned on. The high level of the input terminal IN is transmitted to the first node N1 via the third transistor T3 and the second transistor T2. Therefore, the seventh transistor T7 and the tenth transistor T10 are turned off, and the low level of the first level terminal VGL cannot be transmitted to the output terminal OUT.

At the same time, the high level of the input terminal IN also turns off the fourth transistor T4, so the low level of the first level terminal VGL is transmitted to the third node N3 via the fifth transistor T5 and the first transistor T1. The third node N3 is at a low level to turn on the eighth transistor T8, and a level difference is generated between the two electrodes of the third capacitor C3. The high level of the second clock terminal CB turns off the ninth transistor T9, and the second node N2 floats. Thus, the previous high level of the second node N2 is maintained (the previous level is described later), and the sixth transistor T6 is kept off. Since the load coupled to the output terminal OUT of the shift register is large, the output terminal OUT can maintain the previous low level output for a short period of time (the previous level is described later).

In one embodiment, during this phase, the level of the second clock terminal CB may be changed earlier than the level of the first clock terminal CK. That is, first, the level of the second clock terminal CB becomes higher, and then the first clock terminal CK becomes lower. Therefore, it can be avoided that the first clock terminal CK and the second clock terminal CB are simultaneously at a low level due to the error so as to ensure that the ninth transistor T9 is turned off first and the level of the second node N2 is high, thereby avoiding output of the high level of VGH terminal.

Of course, in each phase, it is also possible to change the level of the first clock terminal CK in synchronization with the level of the second clock terminal CB. However, based on the control precision, error, and the like, it is preferable that in each phase, for the first clock terminal CK and the second clock terminal CB, the one whose level changing from low to high changes first, and the other one whose level changing from high to low changes later.

Second phase S2 includes providing a high level to the input terminal IN, providing a high level to the first clock terminal CK, and providing a low level to the second clock terminal CB.

In this phase, the first clock terminal CK becomes a high level, so the third transistor T3 and the fifth transistor T5 are turned off, the third node N3 is floated to maintain the previous low level, and the second clock terminal CB (ie, the second terminal on the right side of the third capacitor C3) changes from a high level to a low level. Due to the bootstrap effect of the third capacitor C3, the level of the third node N3 is further pulled lower from the low level, thereby causing the gate-source voltage of the first transistor T1 to be greater than its threshold voltage (Vgs>Vth). As such, the first transistor T1 is turned off, the third node N3 is isolated from the fourth node N4, and the third node N3 is prevented from being affected by other parts of the circuit, thereby improving output stability. At the same time, due to the bootstrap effect of the third capacitor C3, the potential of the gate of the eighth transistor T8 is further reduced, thereby enhancing the output capability of the eighth transistor T8. Further, the low level of the second clock terminal CB enters the second node N2 via the eighth transistor T8 and the ninth transistor T9, so that the sixth transistor T6 is stably turned on, and the output terminal OUT starts to stably output the high level of the second level terminal VGH.

At the same time, the low level of the fourth node N4 further turns on the twelfth transistor T12 and the eleventh transistor T11, and transmits the high level of the second level terminal VGH to the first node N1 to ensure that the seventh transistor T7 is turned off. The low level of the first level terminal VGL cannot be output.

In one embodiment, the level of the first clock terminal CK in this phase may first become higher, and then the level of the second clock terminal CB becomes lower. As such, it can be ensured that after the third node N3 becomes floating, the level of the third node N3 is further lowered, and the low level of the fourth node N4 can ensure that the eleventh transistor T11 is turned on, so that the change of status of each transistor is more reliable.

Third phase S3 includes providing a high level to the input terminal IN, providing a low level to the first clock terminal CK, and providing a high level to the second clock terminal CB.

In this phase, the second clock terminal CB becomes a high level, so the second node N2 is floated again. The difference is that the second node N2 maintains the low level of the previous second phase, thereby making the sixth transistor T6 turned on. As such, the shift register stably output a high level. In addition, when the level of the second clock terminal CB changes from low to high, the level of the third node N3 also rises from a level lower than the low level to the low level due to the bootstrap effect of the third capacitor C3. The first transistor T1 is turned back on.

At the same time, since the first clock terminal CK is at a low level, the high level of the input terminal IN is introduced into the first node N1 via the third transistor T3 and the second transistor T2, so that the seventh transistor T7 is kept off.

In one embodiment, the level of the second clock terminal CB becomes higher first in this phase, and then the level of the first clock terminal CK becomes lower again. Therefore, it can be ensured that the ninth transistor T9 is turned off first and the second node N2 is floated, and that the first node N1 becomes higher due to the bootstrap effect of the first capacitor C1, thereby stabilizing the states of the transistors.

Fourth phase S4 includes providing a high level to the first clock terminal CK and a low level to the second clock terminal CB.

In this phase, except for the input terminal IN, the levels of the other terminals are the same as those of the second phase respectively. Since the CK signal of the first clock terminal is high level in this phase, the level of the input terminal IN cannot be written to the circuit. Thus, the states of all transistors in this phase are actually the same as those in the second phase, and the output terminal OUT still stably outputs a high level.

In one embodiment, the level of the first clock terminal CK in this phase may first become higher and then the level of the second clock terminal CB becomes lower again. Therefore, the signal of the input terminal IN can be prevented from entering the circuit to ensure the stability of the high level output.

Fifth phase S5 includes providing a low level to the input terminal IN, providing a low level to the first clock terminal CK, and providing a high level to the second clock terminal CB.

In this phase, the signal of the first clock terminal CK becomes a low level, so the low level of the input terminal IN can be written to the first node N1 via the third transistor T3 and the second transistor T2. The seventh transistor T7 is turned on and the output terminal OUT outputs a low level.

At the same time, the low level of the fifth node N5 turns on the tenth transistor T10, so that the signal of the second level terminal VGH is input to the second node N2, and the sixth transistor T6 is turned off. As such, the signal of the high level cannot be output again.

In one embodiment, due to the influence of the load on the output terminal OUT, the signal of the output terminal OUT in this phase may not be immediately changed to a low level, but is gradually changed. However, since the output terminal OUT cannot be written to the shift register of the next stage at this time (the shift register of the next stage is in the fourth stage), it does not affect the operation of the shift register.

In one embodiment, the level of the second clock terminal CB in this phase may first become higher and then the level of the first clock terminal CK becomes lower again. Therefore, it is ensured that the level of the second node N2 is changed after the ninth transistor T9 is turned off first, thereby ensuring the stability of the output.

Sixth phase S6 includes providing a low level to the input terminal IN.

In this phase, the input terminal IN continues to be low level, and the first clock terminal CK and the second clock terminal CB are continuously switched between high and low levels. That is, this phase is a long-term holding phase, that is, a main phase for causing the light-emitting element 20 to emit light.

When the first clock terminal CK is a low level and the second clock terminal CB is a high level, the state of the circuit is the same as that of the fifth phase, and the shift register outputs a low level.

When the first clock terminal CK is at a high level and the second clock terminal CB is at a low level, the first node N1 and the second node N2 are both floating, so that the previous low level and the high level are respectively maintained. As such, the shift register outputs a low level. Wherein, when the second clock terminal CB changes from a high level to a low level, the level of the first node N1 can be further pulled lower than the low level, so that the gate-source voltage of the second transistor T2 is greater than the threshold voltage thereof (Vgs>Vth). The second transistor T2 is turned off to isolate the first node N1 from the fifth node N5, thereby preventing the level of the first node N1 from being affected by other parts of the circuit. As such, the stability of the output is ensured. At the same time, since the gate potential of the seventh transistor T7 is further reduced, the output capability of the seventh transistor T7 is improved.

It can be understood that the low level and the high level of the first node N1 and the second node N2 respectively maintained in this phase are the levels of the two nodes before the first phase S1.

In one embodiment, in this phase, for the first clock terminal CK and the second clock terminal CB, the one whose level changing from low to high changes first, so that a time when the first clock terminal CK and the second clock terminal CB are both at a high level exists. It should be understood that during this time, each transistor is turned off, so the first node N1 and the second node N2 also maintain the previous levels, and the shift register can still be guaranteed a stable low level output.

Optionally, the amount of time "advanced" when the above level is changed from low to high may be $1/15 \sim 6/15$ of the clock signal period, where the clock signal period refers to a total duration of a high level and an adjacent low level in the clock signal.

It can be seen that, according to the driving method of the shift register according to one embodiment of the present disclosure, the shift register can generate an light-emitting control signal (EM signal) for controlling the state of the light-emitting control transistor, thereby controlling the light-emitting of the pixel circuit.

Moreover, in the shift register, the first transistor T1 and the second transistor T2 can be turned off in a partial period, thereby preventing the levels of the nodes actually playing the role of the output control from being affected by other parts of the circuit, and ensuring the stability of the output.

Figure 3:
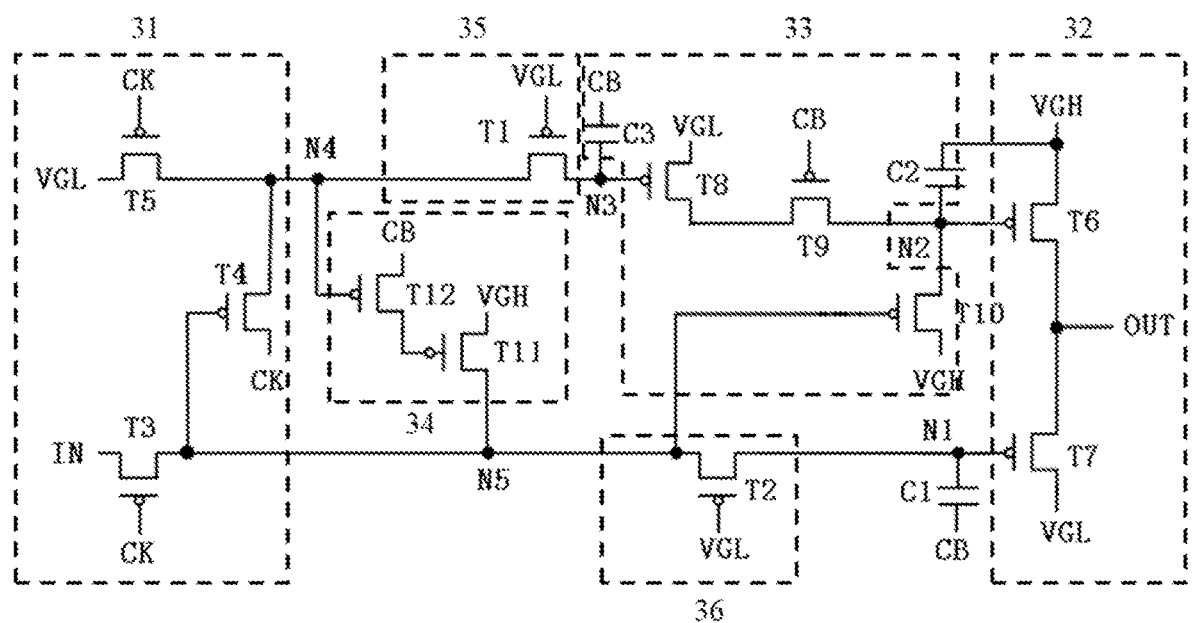
FIG. 3 is a schematic structural diagram of a shift register according to one embodiment of the present disclosure.

In one embodiment, as shown in FIG. 3, the first control unit may also include an eighth transistor T8, a ninth transistor T9, a tenth transistor T10, a second capacitor C2, and a third capacitor C3; wherein:

The first terminal of the eighth transistor T8 is coupled to the first level terminal VGL, the second terminal thereof is coupled to the first terminal of the ninth transistor T9, and the gate thereof is coupled to the third node N3;

The second terminal of the ninth transistor T9 is coupled to the second node N2, and the gate thereof is coupled to the second clock terminal CB;

The first terminal of the tenth transistor T10 is coupled to the second node N2, the second terminal thereof is coupled to the second level terminal VGH, and the gate thereof is coupled to the fifth node N5;

The first terminal of the second capacitor C2 is coupled to the second level terminal VGH, and the second terminal thereof is coupled to the second node N2; and The first terminal of the third capacitor C3 is coupled to the second clock terminal CB, and the second terminal is coupled to the third node N3.

Obviously, the first control unit of the embodiment is also used to further lower the level of the third node N3 to make the first transistor turned off when the third node N3 is originally a low level and the signal of the second clock terminal CB changes from high to low. The first control unit is also used to control the transmission of a low level (which may come from the first level terminal VGL or also from the second clock terminal CB) to the second node N2. Since the function and the operational state of the second control units of the two forms are completely the same, the driving process will not be described in detail here.

Figure 4:
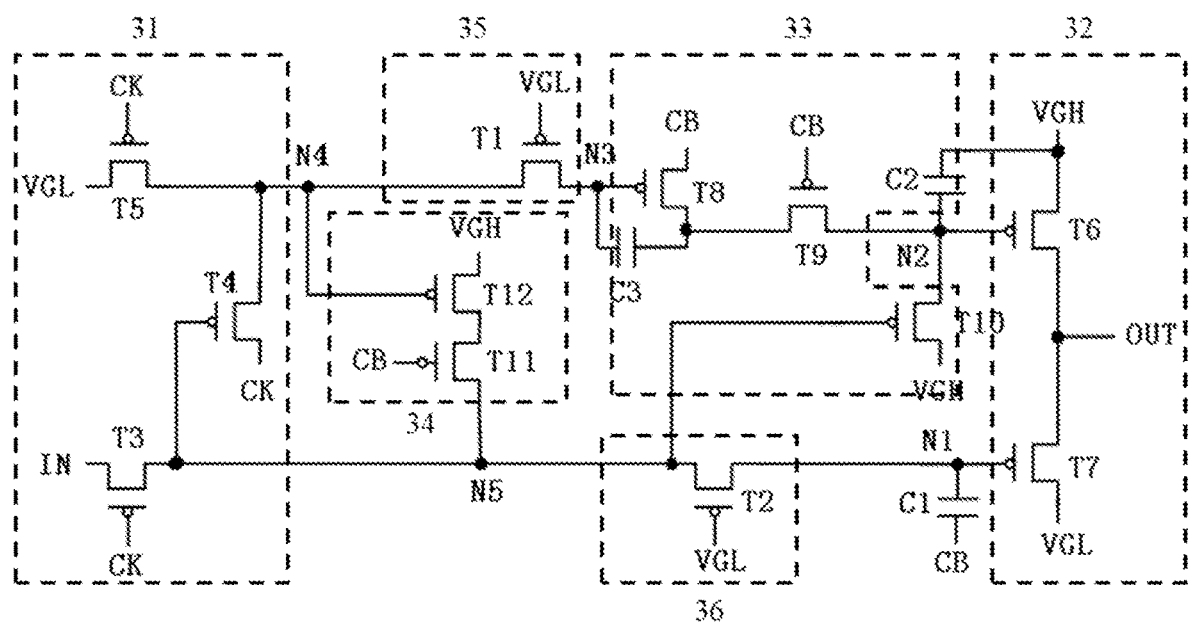
FIG. 4 is a schematic structural diagram of a shift register according to one embodiment of the present disclosure.

In one embodiment, as shown in FIG. 4, the second control unit may also include an eleventh transistor T11 and a twelfth transistor T12. The first terminal of the eleventh transistor T11 is coupled to the second terminal of the twelfth transistor T12, the second terminal thereof is coupled to the fifth node N5, and the gate thereof is coupled to the second clock terminal CB. The first terminal of the twelfth transistor T12 is coupled to the first level terminal VGL, and the gate thereof is coupled to the fourth node N4. Optional, all transistors are P-type transistors.

It should be understood that the second control unit of this form functions to transmit a signal of the second level terminal VGH to the fifth node N5 when the second clock terminal CB and the fourth node N4 are both at a low level (on level). Since the actual function and operational state of the two forms of the second control units are completely the same, the driving process will not be described in detail here.

It should be understood that the first control units and the second control units of the above two forms respectively may be combined with each other in any manner. That is, any form of the first control unit may be combined with any form of the second control unit and used for one shift register.

Specifically, one embodiment of the present disclosure provides a shift register, which includes:

The first transistor T1 has a first terminal coupled to the fourth node N4, a second terminal coupled to the third node N3, and a gate coupled to the first level terminal VGL;

The second transistor T2 has a first terminal coupled to the fifth node N5, a second terminal coupled to the first node N1, and a gate coupled to the first level terminal VGL;

The third transistor T3 has a first terminal coupled to the input terminal IN, a second terminal coupled to the fifth node N5, and a gate coupled to the first clock terminal CK;

The fourth transistor T4 has a first terminal coupled to the fourth node N4, a second terminal coupled to the first clock terminal CK, and a gate coupled to the fifth node N5;

The fifth transistor T5 has a first terminal coupled to the first level terminal VGL, a second terminal coupled to the fourth node N4, and a gate coupled to the first clock terminal CK;

The first capacitor C1 has a first terminal coupled to the first node N1 and a second terminal coupled to the second clock terminal CB;

The sixth transistor T6 has a first terminal coupled to the second level terminal VGH, a second terminal coupled to the output terminal OUT, and a gate coupled to the second node N2;

The seventh transistor T7 has a first terminal coupled to the output terminal OUT, a second terminal coupled to the first level terminal VGL, and a gate coupled to the first node N1;

The eighth transistor T8 has a first terminal coupled to the second clock terminal CB, a second terminal coupled to the second terminal of the third capacitor C3, and a gate coupled to the third node N3;

The ninth transistor T9 has a first terminal coupled to the second terminal of the third capacitor C3, a second terminal coupled to the second node N2, and a gate coupled to the second clock terminal CB;

The tenth transistor T10 has a first terminal coupled to the second node N2, a second terminal coupled to the second level terminal VGH, and a gate coupled to the fifth node N5;

The second capacitor C2 has a first terminal coupled to the second level terminal VGH and a second terminal coupled to the second node N2;

The third capacitor C3 has a first terminal coupled to the third node N3;

The eleventh transistor T11 has a first terminal coupled to the second level terminal VGH, a second terminal coupled to the fifth node N5, and a gate coupled to the second terminal of the twelfth transistor T12; and The twelfth transistor T12 has a first terminal coupled to the second clock terminal CB and a gate coupled to the fourth node N4.

Optionally, all transistors are P-type transistors.

One embodiment of the present disclosure provides a shift register, which includes:

The first transistor T1 has a first terminal coupled to the fourth node N4, a second terminal coupled to the third node N3, and a gate coupled to the first level terminal VGL;

The second transistor T2 has a first terminal coupled to the fifth node N5, a second terminal coupled to the first node N1, and a gate coupled to the first level terminal VGL;

The third transistor T3 has a first terminal coupled to the input terminal IN, a second terminal coupled to the fifth node N5, and a gate coupled to the first clock terminal CK;

The fourth transistor T4 has a first terminal coupled to the fourth node N4, a second terminal coupled to the first clock terminal CK, and a gate coupled to the fifth node N5;

The fifth transistor T5 has a first terminal coupled to the first level terminal VGL, a second terminal coupled to the fourth node N4, and a gate coupled to the first clock terminal CK;

The first capacitor C1 has a first terminal coupled to the first node N1 and a second terminal coupled to the second clock terminal CB;

The sixth transistor T6 has a first terminal coupled to the second level terminal VGH, a second terminal coupled to the output terminal OUT, and a gate coupled to the second node N2;

The seventh transistor T7 has a first terminal coupled to the output terminal OUT, a second terminal coupled to the first level terminal VGL, and a gate coupled to the first node N1;

The eighth transistor T8 has a first terminal coupled to the first level terminal VGL, a second terminal coupled to the first terminal of the ninth transistor T9, and a gate coupled to the third node N3;

The ninth transistor T9 has a second terminal coupled to the second node N2 and a gate coupled to the second clock terminal CB;

The tenth transistor T10 has a first terminal coupled to the second node N2, a second terminal coupled to the second level terminal VGH, and a gate coupled to the fifth node N5;

The second capacitor C2 has a first terminal coupled to the second level terminal VGH and a second terminal coupled to the second node N2;

The third capacitor C3 has a first terminal coupled to the second clock terminal CB, and a second terminal coupled to the third node N3;

The eleventh transistor T11 has a first terminal coupled to the second level terminal VGH, a second terminal coupled to the fifth node N5, and a gate coupled to the second terminal of the twelfth transistor T12; and The twelfth transistor T12 has a first electrode coupled to the second clock terminal CB and a gate coupled to the fourth node N4.

Optionally, all transistors are P-type transistors.

Optionally, one embodiment of the present disclosure provides a shift register, which includes:

The first transistor T1 has a first terminal coupled to the fourth node N4, a second terminal coupled to the third node N3, and a gate coupled to the first level terminal VGL;

The second transistor T2 has a first terminal coupled to the fifth node N5, a second terminal coupled to the first node N1, and a gate coupled to the first level terminal VGL;

The third transistor T3 has a first terminal coupled to the input terminal IN, a second terminal coupled to the fifth node N5, and a gate coupled to the first clock terminal CK;

The fourth transistor T4 has a first terminal coupled to the fourth node N4, a second terminal coupled to the first clock terminal CK, and a gate coupled to the fifth node N5;

The fifth transistor T5 has a first terminal coupled to the first level terminal VGL, a second terminal coupled to the fourth node N4, and a gate coupled to the first clock terminal CK;

The first capacitor C1 has a first terminal coupled to the first node N1 and a second terminal coupled to the second clock terminal CB;

The sixth transistor T6 has a first terminal coupled to the second level terminal VGH, a second terminal coupled to the output terminal OUT, and a gate coupled to the second node N2;

The seventh transistor T7 has a first terminal coupled to the output terminal OUT, a second terminal coupled to the first level terminal VGL, and a gate coupled to the first node N1;

The eighth transistor T8 has a first terminal coupled to the second clock terminal CB, a second terminal coupled to the second terminal of the third capacitor C3, and a gate coupled to the third node N3;

The ninth transistor T9 has a first terminal coupled to the second terminal of the third capacitor C3, a second terminal coupled to the second node N2, and a gate coupled to the second clock terminal CB;

The tenth transistor T10 has a first terminal coupled to the second node N2, a second terminal coupled to the second level terminal VGH, and a gate coupled to the fifth node N5;

The second capacitor C2 has a first terminal coupled to the second level terminal VGH and a second terminal coupled to the second node N2;

The third capacitor C3 has a first terminal coupled to the third node N3;

The eleventh transistor T11 has a first terminal coupled to the second terminal of the twelfth transistor T12, a second terminal coupled to the fifth node N5, and a gate coupled to the second clock terminal CB; and The twelfth transistor T12 has a first terminal coupled to the first level terminal VGL and a gate coupled to the fourth node N4.

Optional, all transistors are P-type transistors.

Optionally, one embodiment of the present disclosure provides a shift register, which includes:

The first transistor T1 has a first terminal coupled to the fourth node N4, a second terminal coupled to the third node N3, and a gate coupled to the first level terminal VGL;

The second transistor T2 has a first terminal coupled to the fifth node N5, a second terminal coupled to the first node N1, and a gate coupled to the first level terminal VGL;

The third transistor T3 has a first terminal coupled to the input terminal IN, a second terminal coupled to the fifth node N5, and a gate coupled to the first clock terminal CK;

The fourth transistor T4 has a first terminal coupled to the fourth node N4, a second terminal coupled to the first clock terminal CK, and a gate coupled to the fifth node N5;

The fifth transistor T5 has a first terminal coupled to the first level terminal VGL, a second terminal coupled to the fourth node N4, and a gate coupled to the first clock terminal CK;

The first capacitor C1 has a first terminal coupled to the first node N1 and a second terminal coupled to the second clock terminal CB;

The sixth transistor T6 has a first terminal coupled to the second level terminal VGH, a second terminal coupled to the output terminal OUT, and a gate coupled to the second node N2;

The seventh transistor T7 has a first terminal coupled to the output terminal OUT, a second terminal coupled to the first level terminal VGL, and a gate coupled to the first node N1;

The eighth transistor T8 has a first terminal coupled to the first level terminal VGL, a second terminal coupled to the first terminal of the ninth transistor T9, and a gate coupled to the third node N3;

The ninth transistor T9 has a second terminal coupled to the second node N2 and a gate coupled to the second clock terminal CB;

The tenth transistor T10 has a first terminal coupled to the second node N2, a second terminal coupled to the second level terminal VGH, and a gate coupled to the fifth node N5;

The second capacitor C2 has a first terminal coupled to the second level terminal VGH and a second terminal coupled to the second node N2;

The third capacitor C3 has a first terminal coupled to the second clock terminal CB, and a second terminal coupled to the third node N3;

The eleventh transistor T11 has a first terminal coupled to the second terminal of the twelfth transistor T12, a second terminal coupled to the fifth node N5, and a gate coupled to the second clock terminal CB;

The twelfth transistor T12 has a first terminal coupled to the first level terminal VGL and a gate coupled to the fourth node N4.

Optionally, all transistors are P-type transistors.

Figure 6:
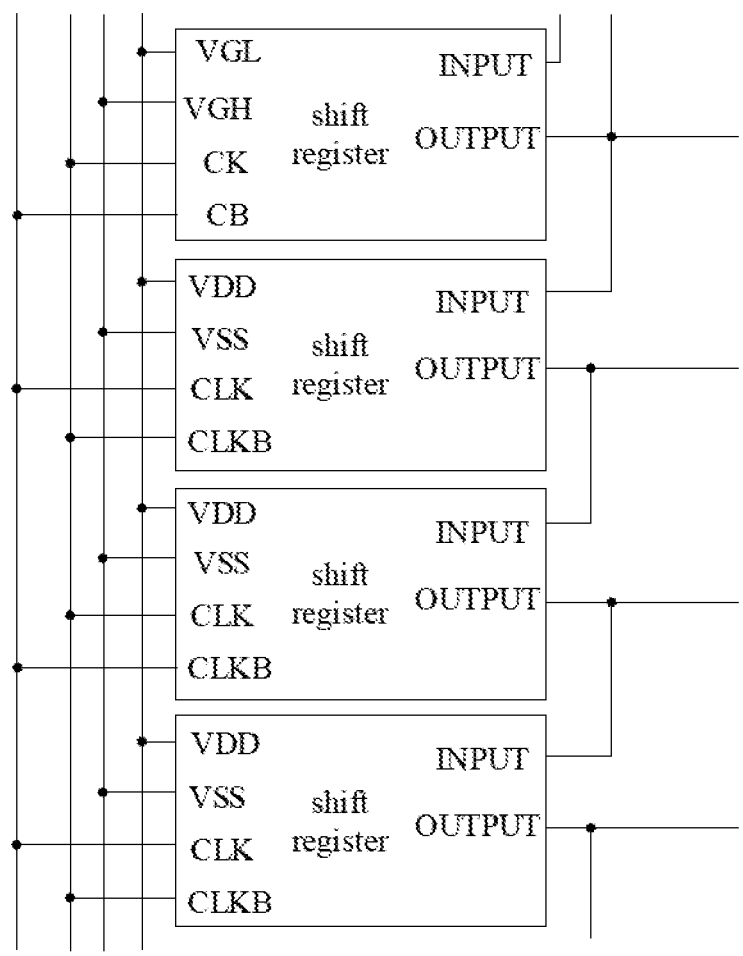
FIG. 6 is a block structural diagram of a light-emitting control circuit according to one embodiment of the present disclosure.

Referring to FIG. 6, one embodiment of the present disclosure provides an light-emitting control circuit, including a plurality of cascaded shift registers of one embodiment of the present disclosure. Except for the last stage of shift register, the output terminal OUT of each of the other shift registers is coupled to the input terminal IN of the next stage of shift register.

As shown in FIG. 6, a plurality of shift registers is cascaded. Specifically, the output terminal OUT of each shift register is respectively coupled to a gate of the light-emitting control transistor in the corresponding pixel circuit and the input terminal IN of the next-stage of shift register.

It should be understood that the output terminal OUT of the last stage of shift register is not coupled to other shift registers, and the input terminal IN of the first stage of shift register is coupled with a separate control signal (such as an STV signal).

It should be understood that since the signals of the first level terminal VGL and the second level terminal VGH are constant, as shown in FIG. 6, the first level terminal sVGL of all shift registers can be powered by a first level line, and the second level terminals VGH of all shift registers can be powered by a second level line.

It should be understood that, since the signals required by the same clock terminal of the adjacent two-stage shift registers are opposite at the same time, as shown in FIG. 6, the clock terminals of all the shift registers can respectively be coupled to two clock lines. Furthermore, the modes of the clock terminals of the adjacent shift registers connecting to the two clock lines respectively are opposite to each other.

Figure 7:
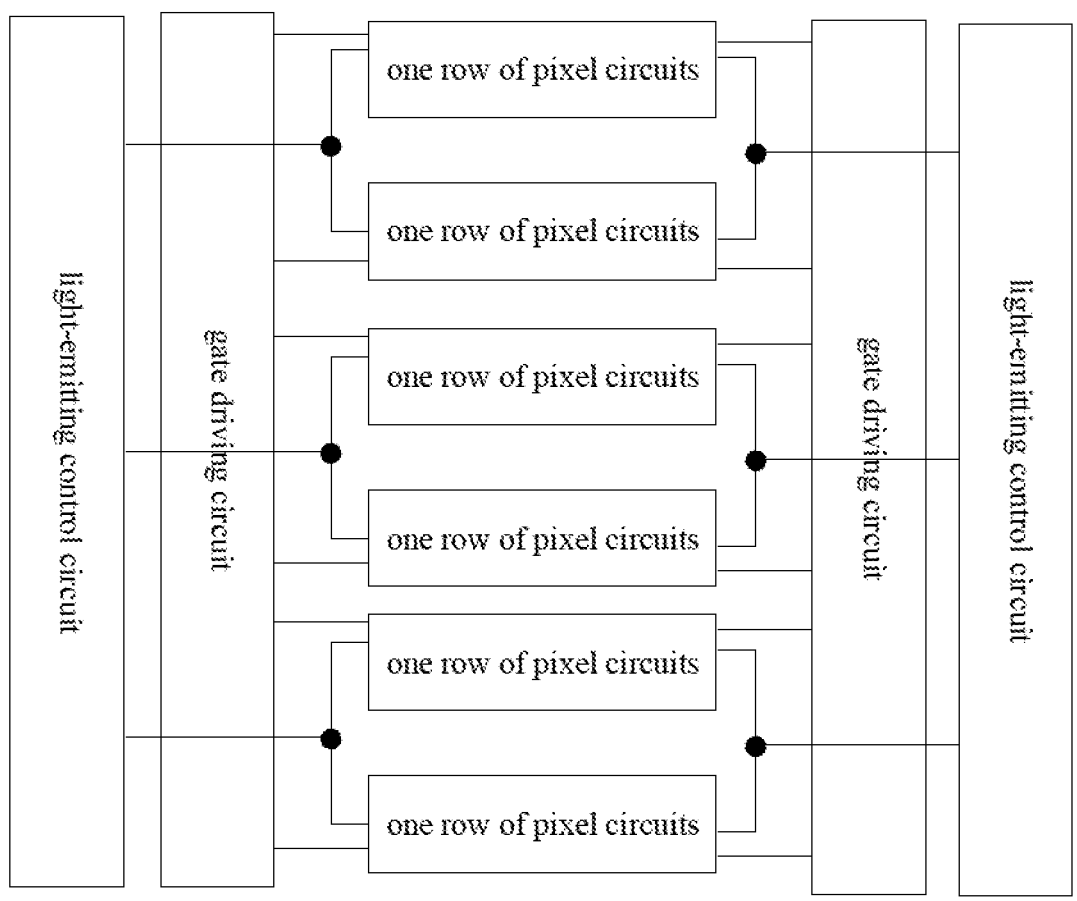
FIG. 7 is a block structural diagram of a display panel according to one embodiment of the present disclosure.
Figure 8:
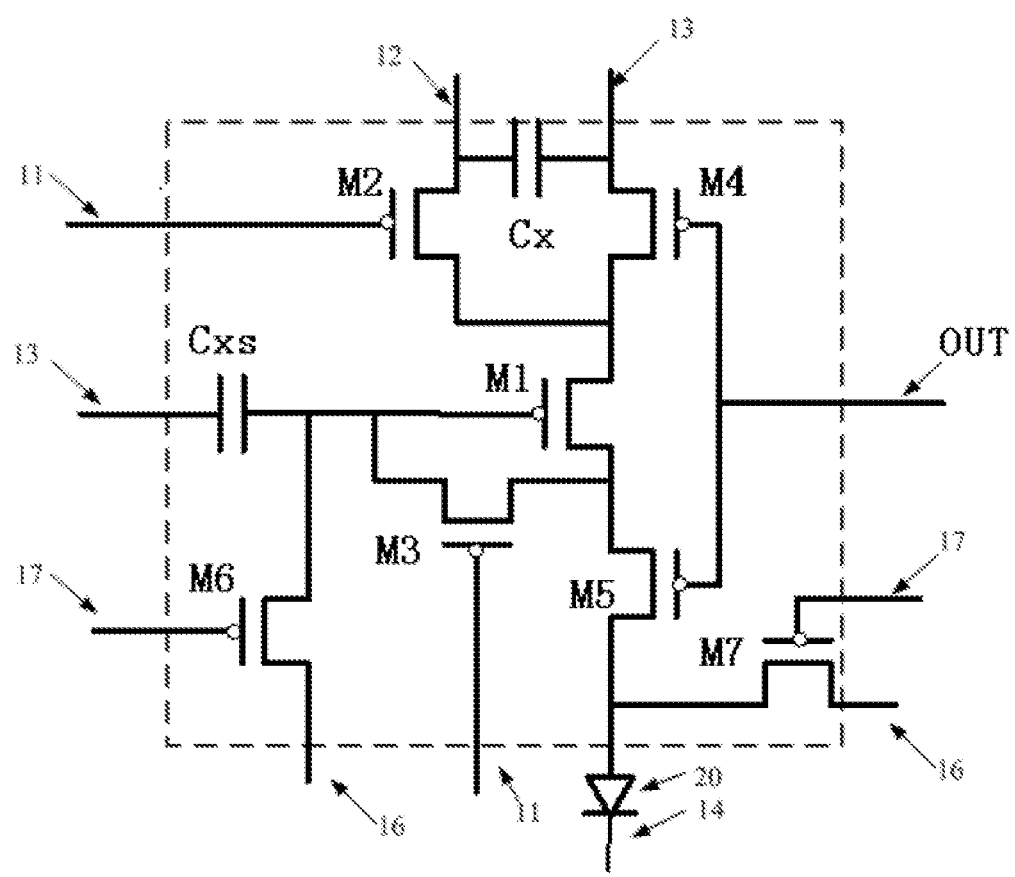
FIG. 8 is a schematic structural diagram of a pixel circuit in a display panel according to one embodiment of the present disclosure.

As shown in FIG. 7, one embodiment of the present disclosure provides a display panel. The display panel includes the light-emitting control circuit according to one embodiment of the present disclosure and a plurality of pixel circuits. As shown in FIG. 8, each pixel circuit according to one embodiment of the present disclosure includes a light-emitting element 20 coupled in series between the first power source 13 and the second power source 14 and at least one light-emitting control transistor. The gate of the light-emitting control transistor is coupled to the output terminal OUT of a stage of shift register in the light-emitting control circuit.

In other words, the above light-emitting control circuit can be disposed in the display panel, and used to control the light-emitting control transistor of each pixel circuit in the display panel, that is, to control whether each pixel circuit emits light.

Optionally, the light-emitting element 20 is an organic light emitting diode (OLED). That is, the above display panel is preferably an OLED display panel.

Specifically, the display panel can be any product or component with display function such as electronic paper, mobile phone, tablet computer, television, display, notebook computer, digital photo frame, navigator, and the like.

Optionally, a plurality of pixel circuits is arranged in an array, wherein rows of pixel circuits are divided into a plurality of groups. Each group includes two adjacent rows of pixel circuits. The gates of the light-emitting control transistors of the two rows of pixel circuits of the same group are coupled to the output terminal OUT of a same stage of shift register in the light-emitting control circuit.

That is, as shown in FIG. 7, a plurality of pixel circuits may be arranged in an array, wherein every two rows of pixel circuits are controlled by a same stage of shift register. This greatly reduces the number of actual shift registers and simplifies product structure.

Of course, in this case, the light-emitting states of the two rows of pixel circuits controlled by the same stage of shift register are the same. If the operational timings of the two rows of pixel circuits have a phase difference, the actual light-emitting periods of the two rows of pixel circuits in the same period of time also have a certain difference. However, the difference is small, basically has no effect on the display, and can be ignored.

Optionally, the number of the light-emitting control circuits is two, and the two light-emitting control circuits are respectively disposed on two opposite sides of the display panel. The gate of the light-emitting control transistor of each pixel circuit is simultaneously coupled to the output terminal OUT of the shift register of the same stage in the two light-emitting control circuits.

As shown in FIG. 7, each side of the display panel may be provided with a light-emitting control circuit, and the light-emitting control transistor in each pixel circuit is jointly controlled by two light-emitting control circuits, thereby reducing the load and signal delay of each light-emitting control circuit.

Optionally, the pixel circuit includes a first pixel transistor M1, a second pixel transistor M2, a third pixel transistor M3, a fourth pixel transistor M4, a fifth pixel transistor M5, a sixth pixel transistor M6, a seventh pixel transistor M7, a pixel capacitor Cx, a pixel storage capacitor Cxs, and a light-emitting element 20. The fourth pixel transistor M4 and the fifth pixel transistor M5 are light-emitting control transistors, and their gates are coupled to the output terminal OUT of one stage of shift register in the light-emitting control circuit.

In one embodiment, the first terminal of the first pixel transistor M1 is coupled to the second terminal of the fourth pixel transistor M4. The second terminal of the first pixel transistor M1 is coupled to the first terminal of the fifth pixel transistor M5, and the gate of the first pixel transistor M1 is coupled to the second terminal of the pixel storage capacitor Cxs.

The first terminal of the second pixel transistor M2 is coupled to the data line 12, and the second terminal thereof is coupled to the second terminal of the fourth pixel transistor M4, and the gate thereof is coupled to the gate line 11.

The first terminal of the third pixel transistor M3 is coupled to the second terminal of the pixel storage capacitor Cxs, the second terminal thereof is coupled to the first terminal of the fifth pixel transistor M5, and the gate thereof is coupled to the gate line 11.

The first terminal of the fourth pixel transistor M4 is coupled to the first power source 13.

The second terminal of the fifth pixel transistor M5 is coupled to the first terminal of the light-emitting element 20.

The first terminal of the sixth pixel transistor M6 is coupled to the second terminal of the pixel storage capacitor Cxs, the second terminal thereof is coupled to the initialization line 16, and the gate thereof is coupled to the reset line 17.

The first terminal of the seventh pixel transistor M7 is coupled to the first terminal of the light-emitting element 20, the second terminal thereof is coupled to the initialization line 16, and the gate thereof is coupled to the reset line 17.

The first terminal of the pixel capacitor Cx is coupled to the data line 12, and the second terminal thereof is coupled to the first power source 13.

The first terminal of the pixel storage capacitor Cxs is coupled to the first power source 13.

The second terminal of the light-emitting element 20 is coupled to the second power source 14.

All pixel transistors are P-type transistors.

Figure 9:
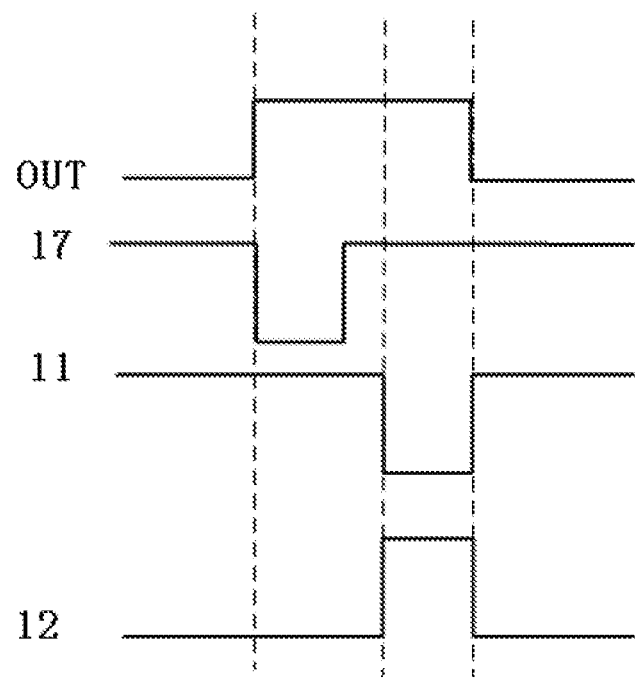
FIG. 9 is a driving timing chart of a pixel circuit in a display panel according to one embodiment of the present disclosure.

That is to say, the pixel circuit according to one embodiment of the present disclosure can be specifically referred to the form of FIG. 8, and the corresponding timing is referred to FIG. 9, which matches the light-emitting control signal (EM signal) generated by the above light-emitting control circuit.

Of course, other types of known pixel circuits may be used, and will not be described in detail here.

Optionally, the display panel according to one embodiment of the present disclosure further includes a gate driving circuit for providing a driving signal to each pixel circuit, wherein the gate driving circuit is coupled to the plurality of gate lines, and each pixel circuit is disposed in the display area.

In one embodiment, the gate driving circuit and the light-emitting control circuit are both disposed outside the display area, and the light-emitting control circuit is located at a side of the gate driving circuit opposite from the display area.

That is to say, a gate drive circuit (GOA) can also be provided in the display panel. The gate driving circuit is also cascaded by a plurality of shift registers (of course, the structure of the shift register in the GOA is different from the structure of the shift register in the light-emitting control circuit). Each shift register is coupled to a gate line 11 for providing a corresponding driving signal to the gate line 11, and each gate line 11 can be coupled to the gate of the switching transistor of each pixel circuit in a row for controlling whether the data signal can be written into the pixel circuit.

In one embodiment, as shown in FIG. 7, each of the above pixel circuits is disposed in a display area for displaying in the middle of the display panel. The light-emitting control circuit is disposed at the outer side of the gate driving circuit (ie, further away from the display area than the gate driving circuit), and coupled to the pixel circuit through the gate drive circuit. That is, the structure of the two circuits can be staggered to make full use of space, thereby facilitating realization of a narrow frame design.

Of course, referring to FIG. 7, if there is a light-emitting control circuit on both sides, the gate drive circuit can also be disposed on both sides, and the light-emitting control circuits on both sides are located at an outer side of the corresponding gate drive circuit.

Wherein, the respective structures of the transistors in the light-emitting control circuit can be disposed in the same layer as the corresponding structures of the pixel transistors in the pixel circuit (of course, formed synchronously). The lead wires in the light-emitting control circuit can also be disposed in the same layer as the other existing structures such as the gate lines 11 and the data lines 12 (source drain) to simplify the preparation process.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A shift register for a display panel, comprising:
an input terminal,
an output terminal,
an input unit,
an output unit,
a first control unit,
a second control unit, and
a first isolation unit,
wherein:
the shift register further includes a fifth node and a second isolation unit;
the input unit is respectively coupled to the input terminal, the fifth node, and a fourth node, and configured to control levels of the first node and the fourth node based on a level of the input terminal;
the first control unit is respectively coupled to a second node and a third node and configured to control levels of the second node and the third node;

the second control unit is respectively coupled to the first node and the fourth node, and configured to transmit a second level to the first node based on the level of the fourth node;

the first isolation unit is between the third node and the fourth node, and configured to isolate the third node from the fourth node when the first control unit changes the level of the third node from a first level further in a direction away from the second level; and the output unit is configured to transmit a first level or a second level to an output terminal based on the levels of the first node and the second node;

the first isolation unit comprises a first transistor; a first terminal of the first transistor is coupled to the fourth node, a second terminal of the first transistor is coupled to the third node, and a gate of the first transistor is coupled to a first level terminal; and the second control unit is coupled to the fifth node and the fourth node; and the second isolation unit is between the fifth node and the first node and configured to isolate the first node from the fifth node when the level of the first node is changed from the first level further in a direction away from the second level.

2. The shift register of claim 1, wherein the second isolation unit comprises a second transistor; a first terminal of the second transistor is coupled to the fifth node, a second terminal of the second transistor is coupled to the first node, and a gate of the second transistor is coupled to the first level terminal.

3. The shift register of claim 2, wherein the first transistor and/or the second transistor are double-gate transistors.

4. The shift register of claim 2, wherein the first transistor and/or the second transistor are metal oxide transistors.

5. The shift register of claim 2, wherein the input unit comprises a third transistor, a fourth transistor, a fifth transistor, and a first capacitor; wherein a first terminal of the third transistor is coupled to the input terminal, a second terminal of the third transistor is coupled to the fifth node, and a gate of the third transistor is coupled to a first clock terminal;

a first terminal of the fourth transistor is coupled to the fourth node, a second terminal of the fourth transistor is coupled to the first clock terminal, and a gate of the fourth transistor is coupled to the fifth node;

a first terminal of the fifth transistor is coupled to the first level terminal, a second terminal of the fifth transistor is coupled to the fourth node, and a gate of the fifth transistor is coupled to the first clock terminal; and a first terminal of the first capacitor is coupled to the first node, and a second terminal of the first capacitor is coupled to a second clock terminal.

6. The shift register of claim 5, wherein the fourth transistor is a double-gate transistor.

7. The shift register of claim 5, wherein the output unit comprises a sixth transistor and a seventh transistor, wherein a first terminal of the sixth transistor is coupled to the second level terminal, a second terminal of the sixth transistor is coupled to the output terminal, and a gate of the sixth transistor is coupled to the second node; and a first terminal of the seventh transistor is coupled to the output terminal, a second terminal of the seventh transistor is coupled to the first level terminal, and a gate of the seventh transistor is coupled to the first node.

8. The shift register of claim 7, wherein the first control unit comprises an eighth transistor, a ninth transistor, a tenth transistor, a second capacitor, and a third capacitor, wherein a first terminal of the eighth transistor is coupled to the second clock terminal, a second terminal of the eighth transistor is coupled to a second terminal of the third capacitor, and a gate of the eighth transistor is coupled to the third node;

a first terminal of the ninth transistor is coupled to the second terminal of the third capacitor, a second terminal of the ninth transistor is coupled to the second node, and a gate of the ninth transistor is coupled to the second clock terminal;

a first terminal of the tenth transistor is coupled to the second node, a second terminal of the tenth transistor is coupled to the second level terminal, and a gate of the tenth transistor is coupled to the fifth node;

a first terminal of the second capacitor is coupled to the second level terminal, and a second terminal of the second capacitor is coupled to the second node; and a first terminal of the third capacitor is coupled to the third node.

9. The shift register of claim 8, wherein the second control unit comprises an eleventh transistor and a twelfth transistor; wherein a first terminal of the eleventh transistor is coupled to the second level terminal, a second terminal of the eleventh transistor is coupled to the fifth node, and a gate of the eleventh transistor is coupled to the second terminal of the twelfth transistor; and a first terminal of the twelfth transistor is coupled to the second clock terminal, and a gate of the twelfth transistor is coupled to the fourth node.

10. The shift register of claim 8, wherein the second control unit comprises an eleventh transistor and a twelfth transistor; wherein a first terminal of the eleventh transistor is coupled to a second terminal of the twelfth transistor, a second terminal of the eleventh transistor is coupled to the fifth node, and a gate of the eleventh transistor is coupled to the second clock terminal; and a first terminal of the twelfth transistor is coupled to the first level terminal, and a gate of the twelfth transistor is coupled to the fourth node.

11. The shift register of claim 7, wherein the first control unit comprises an eighth transistor, a ninth transistor, a tenth transistor, a second capacitor, and a third capacitor, wherein a first terminal of the eighth transistor is coupled to the first level terminal, a second terminal of the eighth transistor is coupled to a first terminal of the ninth transistor, and a gate of the eighth transistor is coupled to the third node;

a second terminal of the ninth transistor is coupled to the second node, and a gate of the ninth transistor is coupled to the second clock terminal;

a first terminal of the tenth transistor is coupled to the second node, a second terminal of the tenth transistor is coupled to the second level terminal, and a gate of the tenth transistor is coupled to the fifth node;

a first terminal of the second capacitor is coupled to the second level terminal, and a second terminal of the second capacitor is coupled to the second node; and a first terminal of the third capacitor is coupled to the second clock terminal, and a second terminal of the third capacitor is coupled to the third node.

12. A light-emitting control circuit, comprising a plurality of cascaded shift registers, each of the plurality of cascaded shift registers being the shift register of claim 1.

13. A display panel, comprising the light-emitting control circuit of claim 12.

14. The display panel of claim 13, further comprising a plurality of pixel circuits;
wherein each of the plurality of pixel circuits comprises a light-emitting element and at least one light-emitting control transistor, a gate of the light-emitting control transistor being coupled to an output terminal of shift register of one stage in the light-emitting control circuit.

15. The display panel according to claim 14, further comprising a gate driving circuit for supplying a driving signal to each of the pixel circuits, wherein the gate driving circuit is coupled to a plurality of gate lines, and each of the pixel circuits is disposed in a display area;
the gate driving circuit and the light-emitting control circuit are both disposed outside the display area, and the light-emitting control circuit is located at a side of the gate driving circuit opposite from the display area.

16. The display panel according to claim 14, wherein the light-emitting element is an organic light-emitting diode.

17. A display panel, comprising a light-emitting control circuit and a plurality of pixel circuits;
wherein the light-emitting control circuit includes a plurality of cascaded shift registers, each of the plurality of cascaded shift registers is a shift register including an input terminal, an output terminal, an input unit, an output unit, a first control unit, a second control unit, and a first isolation unit;
the input unit is respectively coupled to the input terminal and a fourth node, and configured to control levels of the first node and the fourth node based on a level of the input terminal;
the first control unit is respectively coupled to a second node and a third node and configured to control levels of the second node and the third node;
the second control unit is respectively coupled to the first node and the fourth node, and configured to transmit a second level to the first node based on the level of the fourth node;
the first isolation unit is between the third node and the fourth node, and configured to isolate the third node from the fourth node when the first control unit changes the level of the third node from a first level further in a direction away from the second level; and
the output unit is configured to transmit a first level or a second level to an output terminal based on the levels of the first node and the second node;
each of the plurality of pixel circuits comprises a light-emitting element and at least one light-emitting control transistor, a gate of the light-emitting control transistor being coupled to an output terminal of shift register of one stage in the light-emitting control circuit; and
the plurality of the pixel circuits are arranged in an array, rows of pixel circuits are divided into a plurality of groups, each of the plurality of groups comprising two adjacent rows of pixel circuits, and gates of light-emitting control transistors in the two rows of pixel circuits of the same group are coupled to an output terminal of shift register of the same stage in the light-emitting control circuit.

18. The display panel of claim 17, further comprising two light-emitting control circuits respectively disposed on two opposite sides of the display panel, wherein a gate of a light-emitting control transistor of each pixel circuit is respectively coupled to output terminals of shift registers of the same stage in the two light-emitting control circuits.

* * * * *